US011730059B2

(12) United States Patent
Nakagawa

(10) Patent No.: US 11,730,059 B2
(45) Date of Patent: Aug. 15, 2023

(54) ACTUATOR

(71) Applicant: TOYOTA JIDOSHA KABUSHIKI KAISHA, Toyota (JP)

(72) Inventor: Shuji Nakagawa, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/658,359

(22) Filed: Apr. 7, 2022

(65) Prior Publication Data

US 2022/0328750 A1    Oct. 13, 2022

(30) Foreign Application Priority Data

Apr. 12, 2021 (JP) ................... 2021-067002

(51) Int. Cl.
*H02N 1/00* (2006.01)
*H10N 30/20* (2023.01)

(52) U.S. Cl.
CPC ......... *H10N 30/2027* (2023.02); *H02N 1/006* (2013.01)

(58) Field of Classification Search
CPC .......... H02N 1/00; H02N 1/002; H02N 1/004; H02N 1/006; H10N 30/2037
See application file for complete search history.

(56) References Cited

U.S. PATENT DOCUMENTS

| 7,052,244 | B2* | 5/2006 | Fouillet | ............... | F04B 17/00 |
| | | | | | 417/48 |
| 8,174,163 | B2* | 5/2012 | Despesse | ............... | H02N 1/00 |
| | | | | | 384/42 |
| 8,760,032 | B2* | 6/2014 | Despesse | ............... | H02N 1/08 |
| | | | | | 310/309 |
| 9,238,222 | B2* | 1/2016 | Delattre | ............... | B01L 3/50273 |
| 2010/0066203 | A1 | 3/2010 | Takeuchi et al. | | |

FOREIGN PATENT DOCUMENTS

| JP | 2010068667 A | 3/2010 |
| JP | 5714200 B2 | 3/2015 |
| JP | 2021132496 A | 9/2021 |
| WO | 0106575 A1 | 1/2001 |
| WO | 2021015202 A1 | 1/2021 |

OTHER PUBLICATIONS

Shuji Nakagawa, U.S. Appl. No. 17/492,798, filed Oct. 4, 2021.

* cited by examiner

*Primary Examiner* — Burton S Mullins
(74) *Attorney, Agent, or Firm* — Dickinson Wright, PLLC

(57) ABSTRACT

An actuator has a flexible electrode having flexibility, and a base electrode having an opposed face that is opposed to the flexible electrode and is covered with an insulating layer. The flexible electrode deforms to get closer to the opposed face when a voltage is applied to the flexible electrode and the base electrode. The flexible electrode is a rotating body placed on the opposed face. The base electrode is divided into a plurality of electrode portions insulated from each other. The electrode portions are arranged along a predetermined direction. The flexible electrode moves in the predetermined direction relative to the base electrode, while rotating on the opposed face, when the voltage is sequentially applied to the electrode portions in the predetermined direction.

4 Claims, 11 Drawing Sheets

FIG. 2
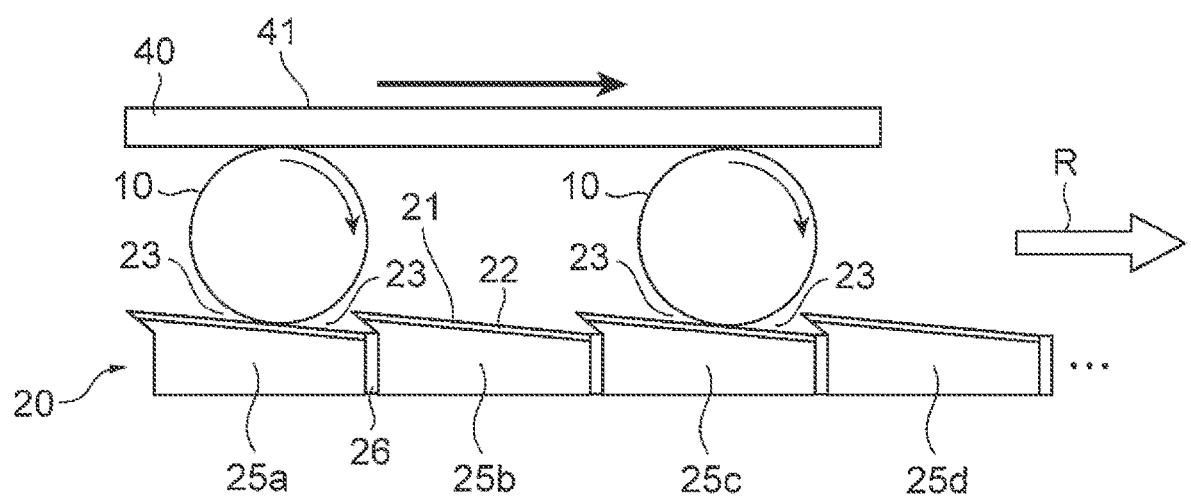
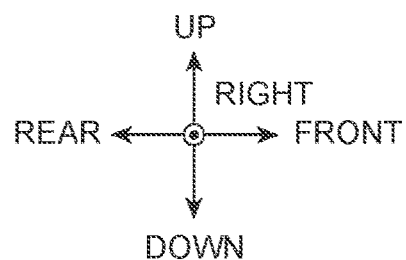

FIG. 10
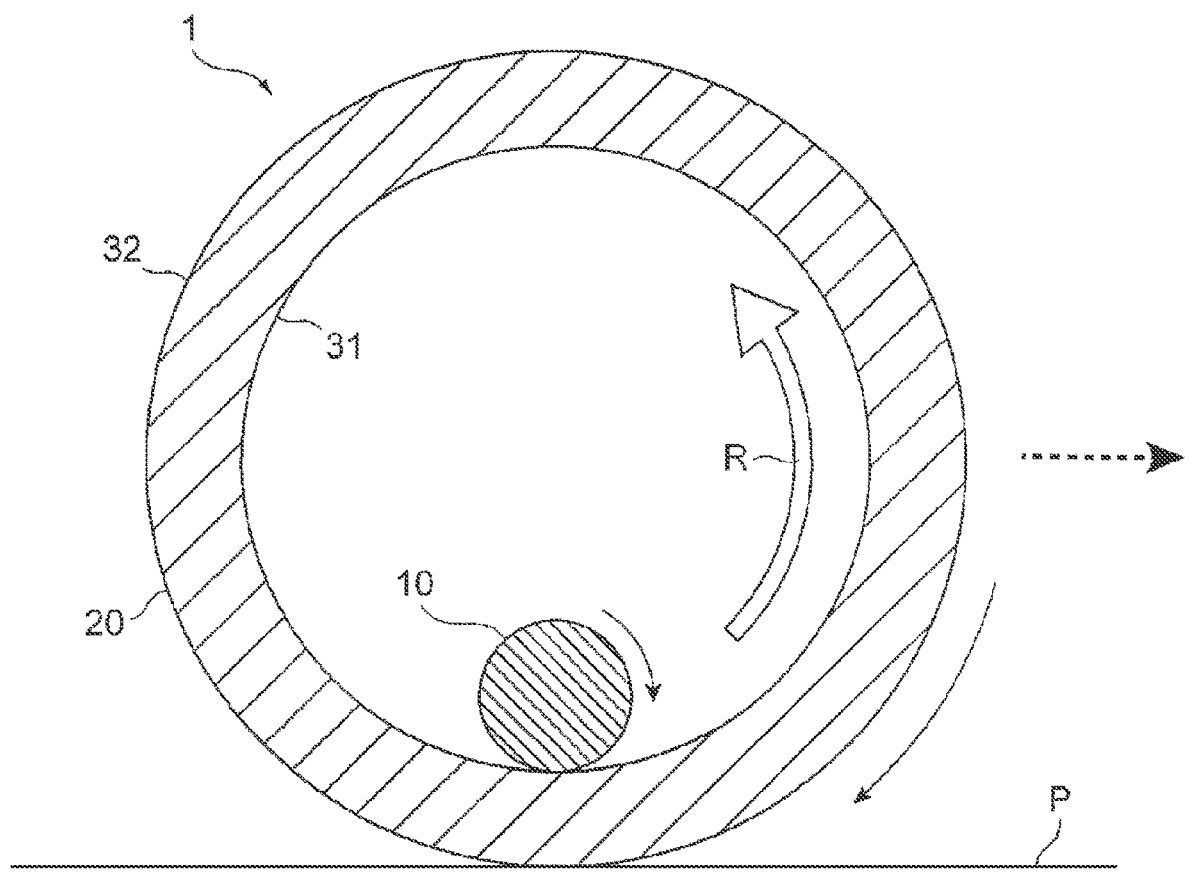
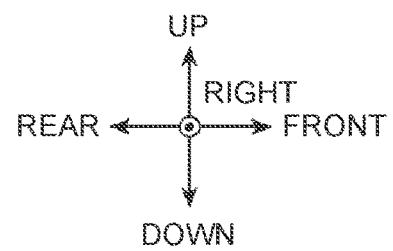

ACTUATOR

CROSS-REFERENCE TO RELATED APPLICATION

This application claims priority to Japanese Patent Application No. 2021-067002 filed on Apr. 12, 2021, incorporated herein by reference in its entirety.

BACKGROUND

1. Technical Field

The present disclosure relates to an actuator.

2. Description of Related Art

A soft actuator that performs mechanical work, using deformation of a member having flexibility as power, is known (see, for example, Japanese Patent No. 5714200 (JP 5714200 B)).

SUMMARY

The actuator described in JP 5714200 B can merely make simple motions, such as a linear motion in a direction along a distance between electrodes or a direction along the electrodes, and there is room for improvement in the patterns of usage as an actuator.

This disclosure provides an actuator that provides a wide variety of patterns of usage as an actuator.

An actuator according to one aspect of the present disclosure includes a flexible electrode having flexibility, and a base electrode having an opposed face that is opposed to the flexible electrode and is covered with an insulating layer. The flexible electrode is configured to deform to get closer to the opposed face when a voltage is applied to the flexible electrode and the base electrode. The flexible electrode is a rotating body placed on the opposed face. The base electrode is divided into a plurality of electrode portions insulated from each other, and the electrode portions are arranged along a predetermined direction. The flexible electrode is configured to move in the predetermined direction relative to the base electrode, while rotating on the opposed face, when the voltage is sequentially applied to the electrode portions in the predetermined direction.

With the above arrangement, the actuator can achieve operation to move the flexible electrode relative to the base electrode. The movement path of the flexible electrode may be relatively freely designed, by setting the arrangement of the electrode portions that constitute the base electrode as desired. When an output member that generates work of the actuator to the outside is attached to the flexible electrode, the output member can move along various paths, according to movement of the flexible electrode. Thus, the actuator according to the above aspect of the present disclosure can provide a wide variety of patterns of usage.

In the actuator as described above, the base electrode may be formed in an annular shape, and may have an inner circumferential surface. The flexible electrode may be placed on the inner circumferential surface, and the opposed face may be the inner circumferential surface. The predetermined direction may extend along a circumferential direction of the inner circumferential surface.

With the above arrangement, the flexible electrode moves relative to the base electrode on the inner circumferential surface of the base electrode, while rotating on the inner circumferential surface. The base electrode can move according to movement of the flexible electrode. The actuator can be used as an actuator in various forms. Thus, the actuator can provide a wide variety of patterns of usage.

The actuator as described above may further include an output member that generates work to an outside according to movement of the flexible electrode. The output member may be a rotating body that is located inside the base electrode, and has an outer circumferential surface that is opposed to the inner circumferential surface of the base electrode. The flexible electrode may be placed between the inner circumferential surface of the base electrode and the outer circumferential surface of the output member, in a condition where the flexible electrode is in contact with the inner circumferential surface and the outer circumferential surface.

With the above arrangement, the output member can rotate according to movement of the flexible electrode. The actuator can be used as an actuator in various forms. Thus, the actuator can provide a wide variety of patterns of usage.

In the actuator as described above, the length of each of the electrode portions measured in the predetermined direction may be shorter than the length of the flexible electrode measured in the predetermined direction.

With the above arrangement, the shape of the base electrode may be simplified, and the degree of freedom in design of the base electrode may be improved. Furthermore, a drive circuit of the actuator can accurately control movement of the flexible electrode. The degree of freedom in the pattern of movement of the flexible electrode may be improved. Thus, the actuator can provide an even wider variety of patterns of usage.

According to the present disclosure, the actuator can provide a wide variety of patterns of usage.

BRIEF DESCRIPTION OF THE DRAWINGS

Features, advantages, and technical and industrial significance of exemplary embodiments of the present disclosure will be described below with reference to the accompanying drawings, in which like signs denote like elements, and wherein:

FIG. 2 is a view useful for describing an output member of the actuator shown in FIG. 1;

FIG. 10 is a view useful for describing an actuator of a third embodiment; and

DETAILED DESCRIPTION OF EMBODIMENTS

Some embodiments of the present disclosure will be described with reference to the drawings. Constituent elements to which the same reference signs are assigned in each of the embodiments have substantially the same functions in the embodiments, unless particularly mentioned otherwise, and the elements will not be further described.

First Embodiment

Figure 1:
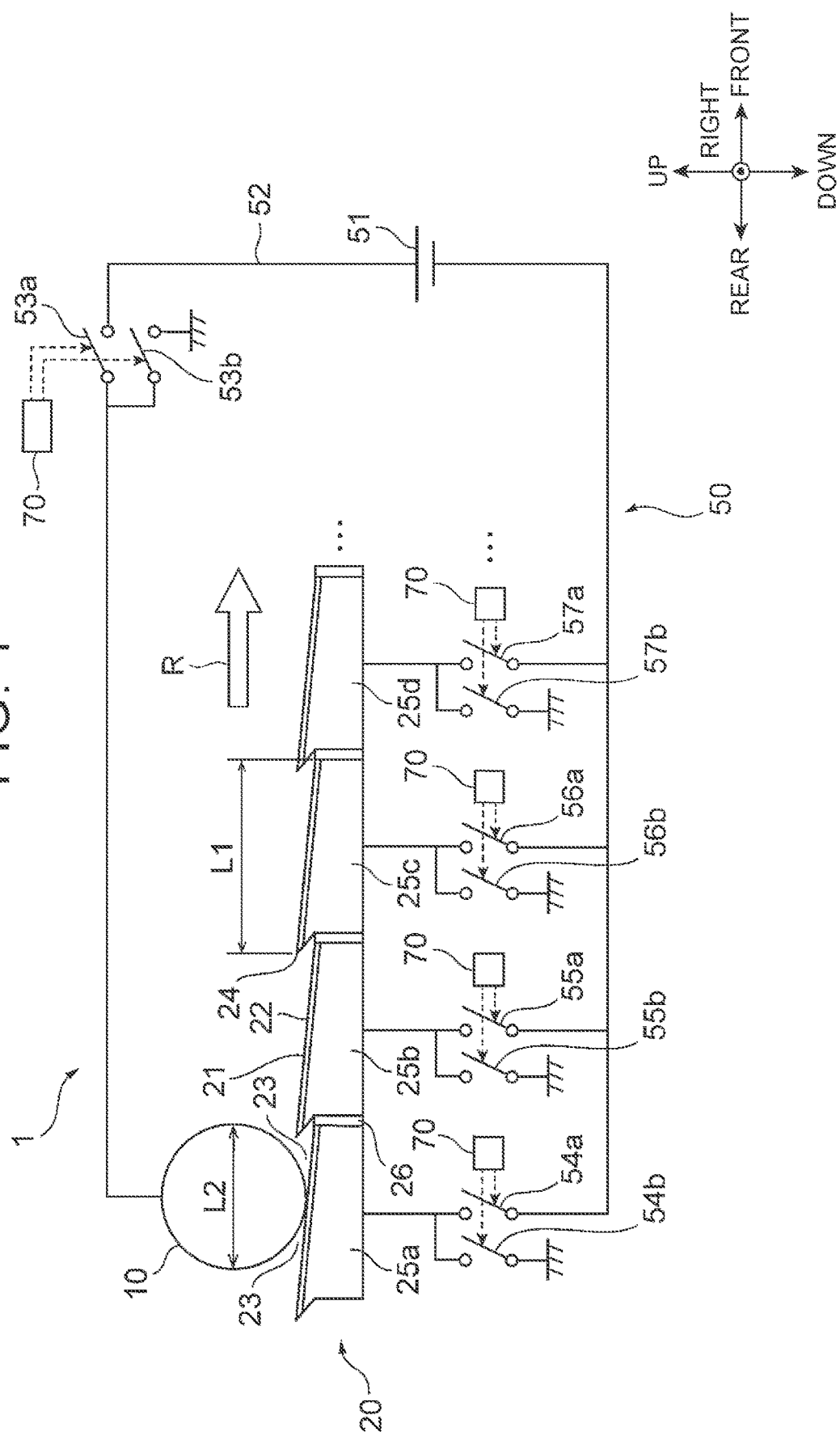
FIG. 1 is a view schematically showing the configuration of an actuator of a first embodiment.

Referring to FIG. 1 to FIG. 5, an actuator 1 of a first embodiment will be described. FIG. 1 schematically shows the configuration of the actuator 1 of the first embodiment. FIG. 2 is useful for describing an output member 40 of the actuator 1 shown in FIG. 1.

The actuator 1 is a soft actuator that performs mechanical work, using deformation of a flexible electrode 10 having flexibility as power. Unlike a conventional soft actuator that has a dielectric elastomer sandwiched between a pair of electrodes, and uses deformation of the dielectric elastomer as power, the flexible electrode 10 itself deforms in the actuator 1. The actuator 1 may be applied to various actuators used in various industrial machines or robots, for example.

Figure 3:
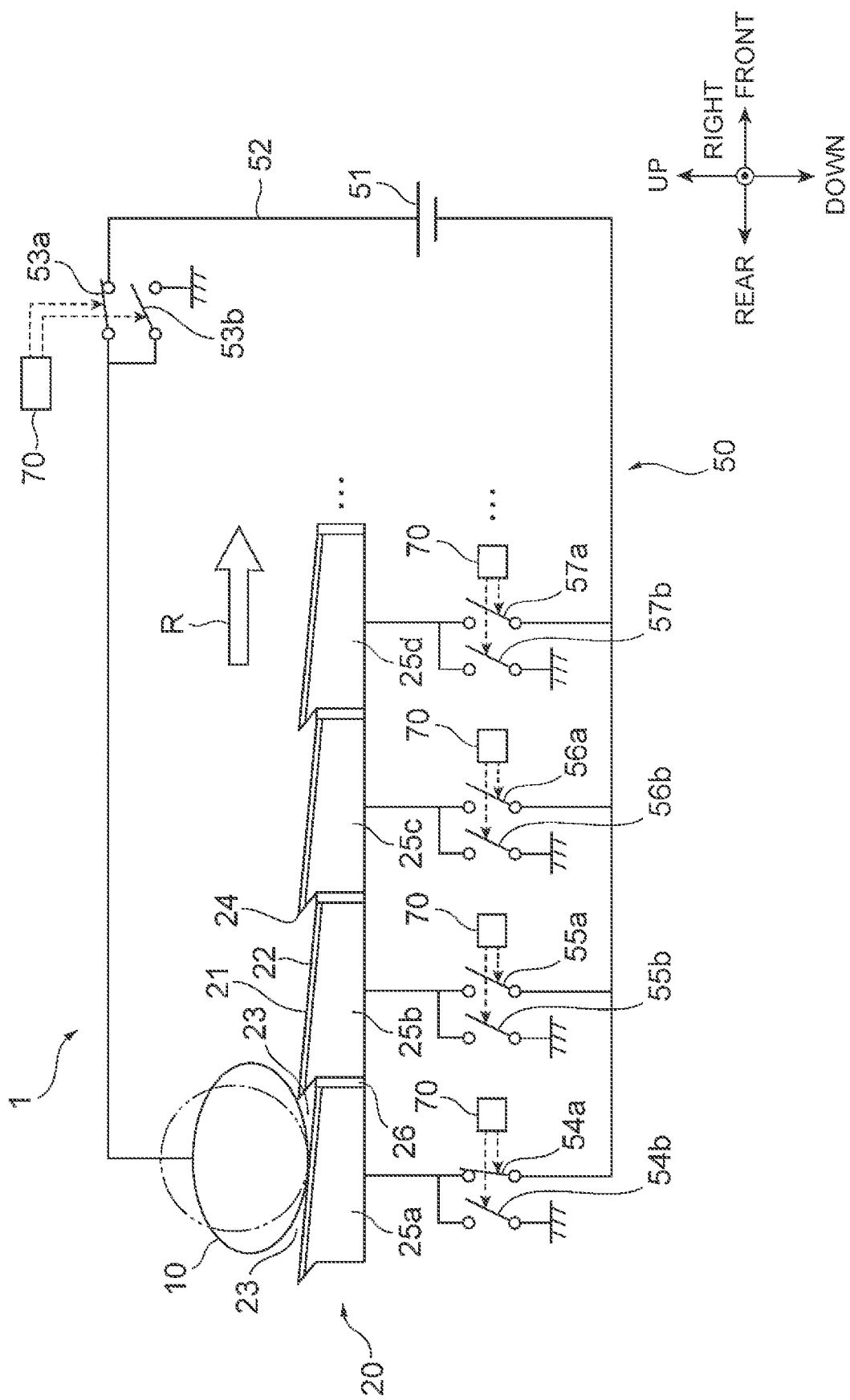
FIG. 3 is a view (No. 1) useful for describing a process of driving the actuator shown in FIG. 1.

In the actuator 1 of the first embodiment, the flexible electrode 10 is deformed by use of coulomb force generated when a voltage is applied to the flexible electrode 10 and the base electrode 20, such that the flexible electrode 10 gets closer to an opposed face 21 of the base electrode 20 that is opposed to the flexible electrode 10 (see FIG. 3). At this time, the actuator 1 applies a voltage to a part of the base electrode 20 and the flexible electrode 10. Then, the actuator 1 stops applying the voltage to the electrodes 10, 20, so that a part of the flexible electrode 10 is restored (see FIG. 4). Then, the actuator 1 applies a voltage to another part of the base electrode 20 and the flexible electrode 10 (see FIG. 5). By repeating application and stop of voltage in this manner, the actuator 1 can achieve operation to move the flexible electrode 10 relative to the base electrode 20. In this embodiment, the direction in which the flexible electrode 10 moves relative to the base electrode 20 will also be called "relative movement direction R". The relative movement direction R is one example of the "predetermined direction" stated in the appended claims.

The actuator 1 includes the flexible electrode 10 having flexibility, and the base electrode 20 for applying voltage so as to generate coulomb force that deforms the flexible electrode 10.

The flexible electrode 10 is formed from a conductor having flexibility. The flexibility of the flexible electrode 10 is set to such a degree that the flexible electrode 10 deforms under the action of coulomb force generated upon application of voltage to the flexible electrode 10 and the base electrode 20, and reverts to its original shape (the shape before deformation, namely, the shape before application of the voltage) when application of the voltage is stopped.

The flexible electrode 10 may be formed using conductive rubber or conductive gel, for example. The conductive rubber may be an elastomer formed with a conductive material mixed thereto, for example. The conductive material may be selected from a fine powder of carbon black, acetylene black, or carbon nanotube, metallic fine powder of silver or copper, conductive fine powder of a core-shell structure formed by coating an insulator of silica or alumina with a metal by sputtering, for example, and so forth. The above-mentioned conductive gel may be a functional gel material in which a solvent, such as water or a moisturizing agent, electrolyte, additive, etc. are held in a three-dimensional polymer matrix, for example. One example of the functional gel material is ST-gel (registered trademark) of Sekisui Kasei Co., Ltd.

The flexible electrode 10 is a rotating body that is placed on the opposed face 21 of the base electrode 20 opposed to the flexible electrode 10. The rotating body is a three-dimensional object formed by rotating a plane, such as a rectangular plane, on the same plane as a certain axis, in an orbital direction of the axis. The central axis of rotation of the flexible electrode 10 as the rotating body intersects (at right angles, for example) with the relative movement direction R, and extends along the opposed face 21 of the base electrode 20 (in parallel with the opposed face 21, for example). A cross section of an outer surface of the flexible electrode 10 cut in a plane (plane including the vertical direction and the longitudinal direction) including the normal direction of the opposed face 21 of the base electrode 20 and the relative movement direction R is formed in a rounded and closed shape. For example, the cross section of the outer surface of the flexible electrode 10 is formed in the shape of a circle, ellipse, or oval, for example. The flexible electrode 10 may be formed in the shape of a sphere, sold cylinder, cylinder, or circular ring, for example. In this embodiment, the flexible electrode 10 is formed in a spherical shape.

When a voltage is applied to the flexible electrode 10 and the base electrode 20, the flexible electrode 10 moves relative to the base electrode 20, while rotating on the opposed face 21 of the base electrode 20. In this embodiment, the base electrode 20 does not move, and the flexible electrode 10 moves on the opposed face 21. In this embodiment, the flexible electrode 10 is placed on the opposed face 21 of the base electrode 20, and rolls on the opposed face 21 upon application of the voltage. The relative movement direction R of the flexible electrode 10 of this embodiment is a front direction. The actuator 1 may have two or more flexible electrodes 10.

The base electrode 20 is formed from a conductor having rigidity. The base electrode 20 may be formed of a metallic material, such as iron, copper, or aluminum. The base electrode 20 may also be formed by coating one surface of a substrate formed using a non-metallic material, such as ceramics, having heat resistance, rigidity, and insulation property, with a metallic film having conductivity, for example. The surface of the substrate coated with the metallic film is opposed to the flexible electrode 10.

The opposed face 21 of the base electrode 20 opposed to the flexible electrode 10 is coated with an insulating layer 22. The insulating layer 22 is formed using a ferroelectric body formed of ceramics, so that electric charge accumulated in the base electrode 20 through application of voltage to the flexible electrode 10 and the base electrode 20 is surely maintained. In particular, the insulating layer 22 is formed using a ferroelectric substance having a perovskite structure. The ferroelectric substance having the perovskite structure may be selected from, for example, barium titanate ($BaTiO_3$), lead titanate ($PbTiO_3$), lead zirconate titanate ($Pb(Zr, Ti)O_3$), lanthanum-doped lead zirconate titanate ($(Pb, La)(Zr, Ti)O_3$), strontium titanate ($SrTiO_3$), strontium barium titanate ($(Ba, Sr)TiO_3$), potassium sodium niobate ($(NaK)NbO_3$), etc. A substance, such as $CaZrO_3$ or $BaSnO_3$, may be dissolved in barium titanate.

The material used for forming the insulating layer 22 preferably has a relative permittivity high enough to generate coulomb force that deforms the flexible electrode 10. The relative permittivity of the insulating layer 22 may be 1000 or higher when it employs ceramics (fine ceramics), for example. The relative permittivity of barium titanate is around 1000 to 10000. The relative permittivity of lead zirconate titanate is 500 to 5000. The relative permittivity of strontium titanate is 200 to 500. The ferroelectric substances having the perovskite structure have high relative permittivities.

The base electrode 20 is formed in the shape of a plate extending in the relative movement direction R (the longitudinal direction). The length of the base electrode 20 measured in the relative movement direction R is longer than the length of the flexible electrode 10 measured in the relative movement direction R. The opposed face 21 of the base electrode 20 is inclined relative to a contact plane of the flexible electrode 10, except for a contact portion of the flexible electrode 10 with the base electrode 20. Space 23 is formed between the flexible electrode 10 and the base electrode 20. The space 23 is formed on the front side and rear side of the contact portion of the flexible electrode 10 with the base electrode 20. The space 23 is provided for receiving the flexible electrode 10 that deforms so as to get closer to the opposed face 21 of the base electrode 20, when a voltage is applied to the flexible electrode 10 and the base electrode 20.

The opposed face 21 of the base electrode 20 is divided into two or more sections, so that the base electrode 20 is divided into two or more electrode portions 25a to 25d. The number of the electrode portions to which the base electrode 20 is divided is arbitrarily selected. The electrode portions 25a to 25d are insulated from each other by plate-like insulating portions 26. With the plate-like insulating portions 26 thus provided, voltages are independently and individually applied to the electrode portions 25a to 25d, and the flexible electrode 10. In this embodiment, each of the electrode portions 25a to 25d will also be generally called "electrode portion 25".

The electrode portions 25a to 25d are arranged along the relative movement direction R of the flexible electrode 10. The relative movement direction R is not limited to the rectilinear direction as shown in FIG. 1, but may be a curvilinear direction, or a loop-like direction. The relative movement direction R may be relatively freely designed, by setting the locations of the electrode portions 25a to 25d as desired. Namely, the actuator 1 permits the movement path of the flexible electrode 10 to be relatively freely designed, by setting the locations of the electrode portions 25a to 25d as desired. In operation, voltages are sequentially applied to the electrode portions 25a to 25d in the relative movement direction R. In this embodiment, voltages are sequentially applied to the electrode portions 25a to 25d toward the front.

The length L1 of each of the electrode portions 25a to 25d measured in the relative movement direction R is longer than the length L2 of the flexible electrode 10 measured in the relative movement direction R (L1>L2). The opposed face 21 of each of the electrode portions 25a to 25d is gently inclined downward (in the direction of gravitational force), when viewed in the front direction.

A protruding portion 24 is formed at a rear edge portion (an edge portion in a direction opposite to the relative movement direction R of the flexible electrode 10) of each of the electrode portions 25a to 25d. The protruding portion 24 protrudes rearward from the rear edge portion of each of the electrode portions 25a to 25d. The length of the protruding portion 24 measured in the relative movement direction R is longer than the length of the insulating portion 26 measured in the relative movement direction R. The length of the protruding portion 24 measured in the relative movement direction R is set to such a length that the flexible electrode 10 located on the opposed face 21 of the electrode portion 25 adjacent to the electrode portion 25 formed with the protruding portion 24 contacts with the protruding portion 24 when the flexible electrode 10 deforms so as to get closer to the opposed face 21 upon application of voltage (see FIG. 3).

The actuator 1 has an output member 40 that generates work of the actuator 1 to the outside of the actuator 1. The output member 40 is a driven member that is displaced according to motion of the actuator 1. The output member 40 is designed as appropriate, according to the specifications, etc. of an object to which work of the actuator 1 is to be generated.

The output member 40 is attached to the flexible electrode 10 that moves on the opposed face 21 of the base electrode 20. For example, the output member 40 may be provided by a rod-like member that extends in the lateral direction from the flexible electrode 10. In this case, the output member 40 is displaced in accordance with movement of the flexible electrode 10, thereby to move an object that is in abutting contact with the output member 40. When two or more flexible electrodes 10 are provided, the output member 40 may be provided by a plate-like member 41 that extends in the longitudinal direction and lateral direction, as shown in FIG. 2. The plate-like member 41 is placed on the flexible electrodes 10. In this case, an object may be placed on the output member 40, and the output member 40 is displaced in accordance with movement of the flexible electrodes 10, so that it can move the object placed on the output member 40.

The actuator 1 is connected to a drive circuit 50 that applies voltage to the flexible electrode 10 and the base electrode 20, so as to drive the actuator 1.

The drive circuit 50 includes a power supply 51 provided by a direct-current (DC) voltage source, or the like, wiring 52 that connects each constituent element of the drive circuit 50 with the flexible electrode 10 and the base electrode 20, switches 53a to 57b provided by semiconductor devices, or the like, and a controller 70 provided by an integrated circuit, or the like.

The flexible electrode 10 is connected to one of the positive electrode and negative electrode of the power supply 51 via the wiring 52, and is also connected to a frame ground (or grounded). Each of the electrode portions 25a to 25d that constitute the base electrode 20 is connected to the other of the positive electrode and negative electrode of the power supply 51 via the wiring 52, and is also connected to the frame ground. The switch 53a is connected between the flexible electrode 10 and the power supply 51. The switch 53b is connected between the flexible electrode 10 and the frame ground. The switch 54a is connected between the electrode portion 25a and the power supply 51. The switch 54b is connected between the electrode portion 25a and the frame ground. The switch 55a is connected between the electrode portion 25b and the power supply 51. The switch 55b is connected between the electrode portion 25b and the frame ground. The switch 56a is connected between the electrode portion 25c and the power supply 51. The switch 56b is connected between the electrode portion 25c and the frame ground. The switch 57a is connected between the electrode portion 25d and the power supply 51. The switch 57b is connected between the electrode portion 25d and the frame ground.

The controller 70 is a circuit that controls each constituent element of the drive circuit 50. The controller 70 controls the ON/OFF states of the switches 53a to 57b, to switch between application of voltage to the flexible electrode 10 and each of the electrode portions 25a to 25d that constitute the base electrode 20, and stop of application of the voltage. Also, the controller 70 can control the amount of the applied voltage, by controlling the amount of the output voltage of the power supply 51. In this manner, the controller 70 can control the magnitude of the coulomb force acting on the flexible electrode 10, and control the amount of deformation of the flexible electrode 10. Further, the controller 70 can control the speed of deformation of the flexible electrode 10, by controlling the speed of switching between application and stop of voltage. Further, the controller 70 can control the timing of deformation of the flexible electrode 10, by controlling the timing of switching between application and stop of voltage.

Figure 4:
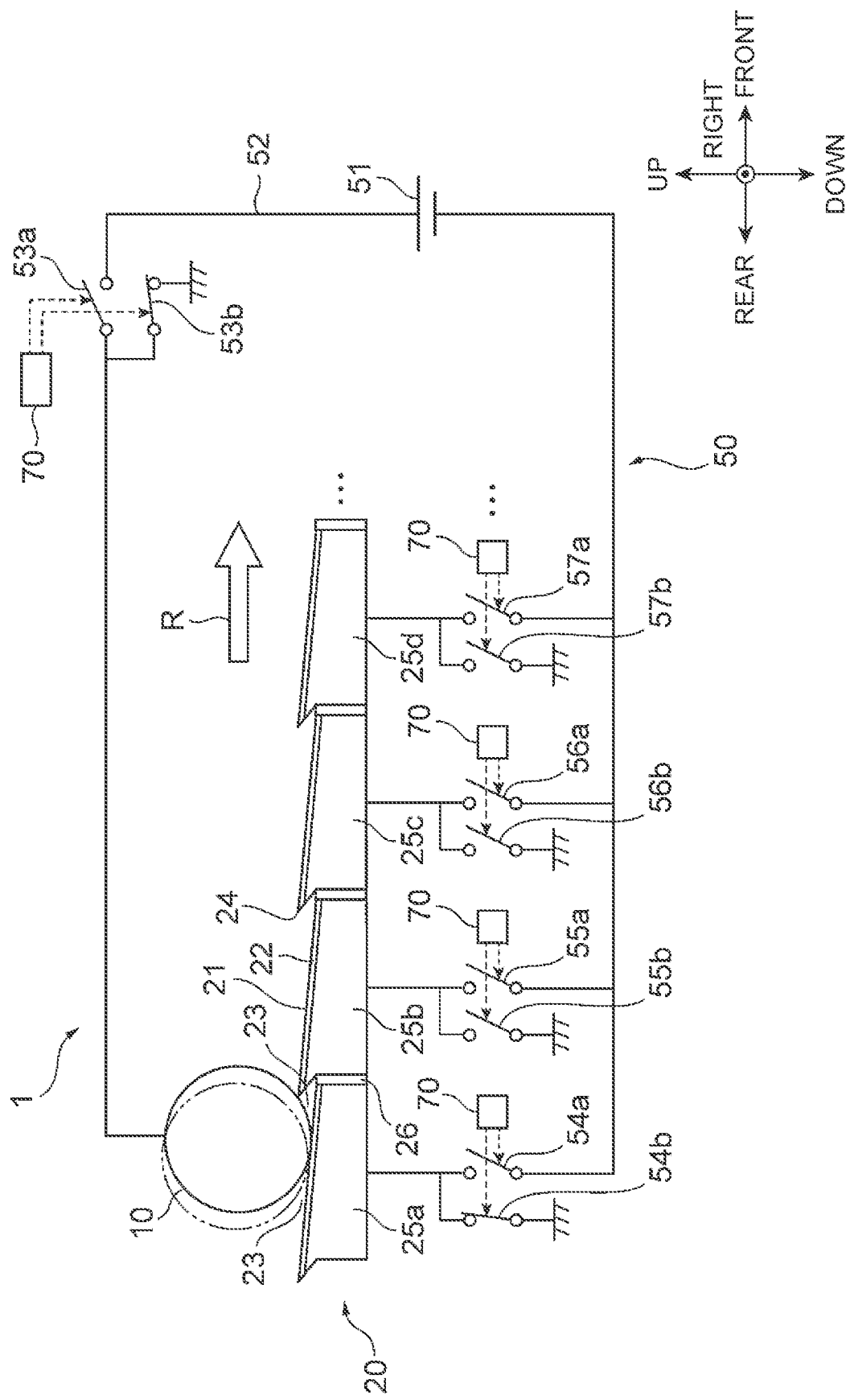
FIG. 4 is a view (No. 2) useful for describing the process of driving the actuator shown in FIG. 1.
Figure 5:
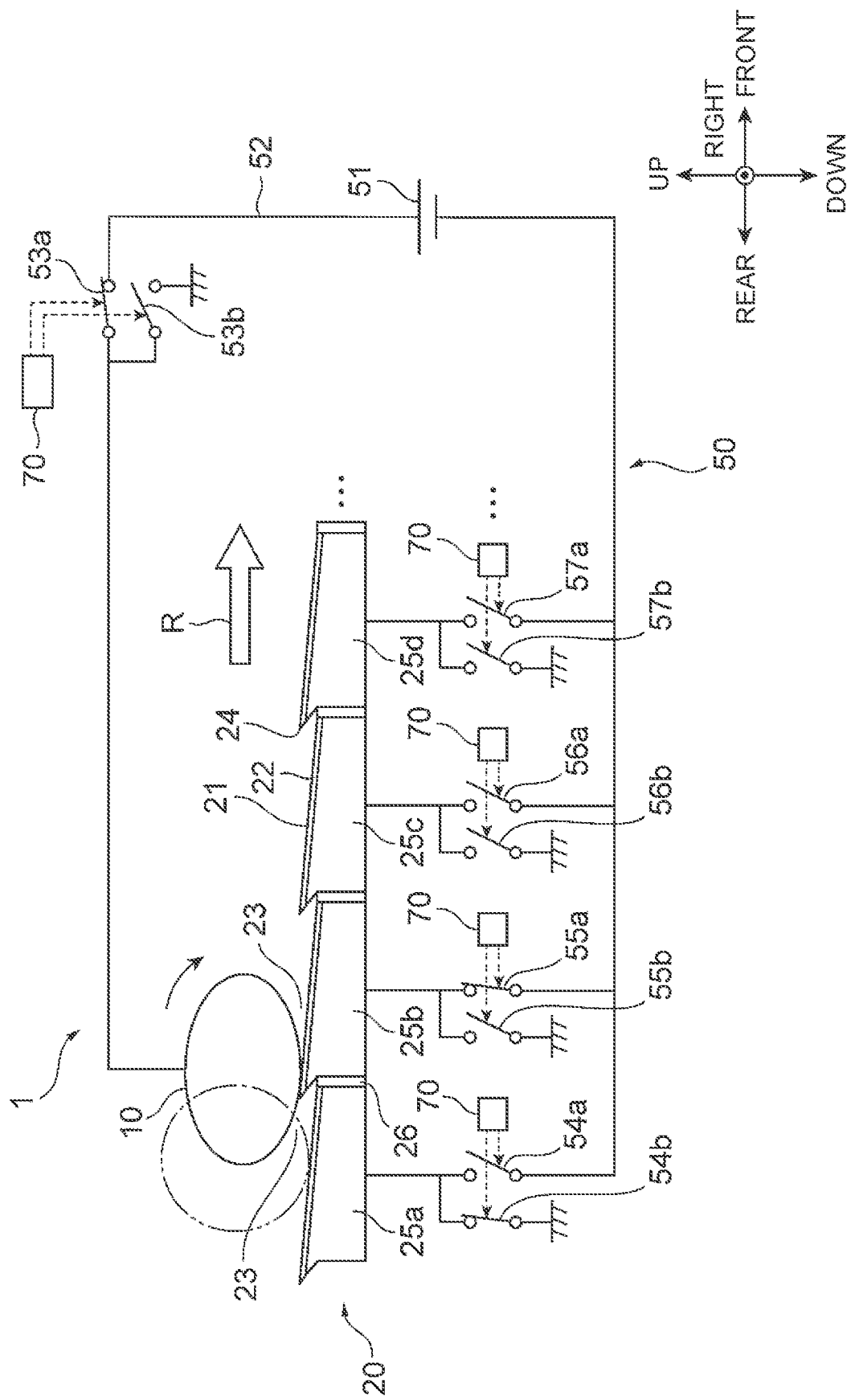
FIG. 5 is a view (No. 3) useful for describing the process of driving the actuator shown in FIG. 1.

FIG. 3 is a view (No. 1) useful for describing a process of driving the actuator 1 shown in FIG. 1. FIG. 4 is a view (No. 2) useful for describing the process of driving the actuator 1 shown in FIG. 1. FIG. 5 is a view (No. 3) useful for describing the process of driving the actuator 1 shown in FIG. 1. In FIG. 3 to FIG. 5, two-dot chain lines indicate the original shape of the flexible electrode 10 at the initial position before application of voltage.

As shown in FIG. 3, the controller 70 of the drive circuit 50 controls the switches 53a, 54a to the ON states, and controls the switches 53b, 54b, 55a to 57b to the OFF states. Then, a voltage is generated between the flexible electrode 10, and the electrode portion 25a corresponding to the position of the flexible electrode 10. In this case, the flexible electrode 10 connected to the positive electrode of the power supply 51 is positively charged, and the electrode portion 25a connected to the negative electrode of the power supply 51 is negatively charged. The insulating layer 22 that covers the opposed face 21 of the electrode portion 25a has a dielectric polarization. The insulating layer 22 of the electrode portion 25a is positively charged at around the interface with the electrode portion 25a, and is negatively charged at around a surface (on the space 23 side) opposite to the above interface. As a result, coulomb force is generated between the insulating layer 22 of the electrode portion 25a and the flexible electrode 10. With the coulomb force thus generated, the flexible electrode 10 is attracted to the insulating layer 22 of the electrode portion 25a. Namely, with the coulomb force, the flexible electrode 10 located on the opposed face 21 of the electrode portion 25a deforms so as to get closer to the opposed face 21 of the electrode portion 25a. With the flexible electrode 10 thus deformed, the flexible electrode 10 is brought into contact with the protruding portion 24 formed at the rear edge portion of the electrode portion 25b located adjacent to the electrode portion 25a in the front direction.

After the case shown in FIG. 3, the controller 70 of the drive circuit 50 controls the switches 53b, 54b to the ON states, and controls the switches 53a, 54a, 55a to 57b to the OFF states, as shown in FIG. 4. Then, application of voltage to the flexible electrode 10 and the electrode portion 25a is stopped. In this case, electric charge accumulated between the flexible electrode 10 and the electrode portion 25a of the base electrode 20 is released to the frame ground. The flexible electrode 10 deforms so as to be spaced apart from the opposed face 21 of the electrode portion 25a under the restoring force of the flexible electrode 10, and reverts to the original shape. At this time, the flexible electrode 10 reverts to the original shape, in a condition where it is in contact with the protruding portion 24 of the electrode portion 25b.

After the case shown in FIG. 4, the controller 70 of the drive circuit 50 controls the switches 53a, 54b, 55a to the ON states, and controls the switches 53b, 54a, 55b, 56a to 57b to the OFF states, as shown in FIG. 5. Then, a voltage is applied to the flexible electrode 10, and the electrode portion 25b having the protruding portion 24 with which the flexible electrode 10 is in contact. In this case, coulomb force is generated between the insulating layer 22 of the electrode portion 25b and the flexible electrode 10. With the coulomb force thus generated, the flexible electrode 10 that contacts with the protruding portion 24 of the electrode portion 25b deforms so as to get closer to the opposed face 21 of the electrode portion 25b. With the flexible electrode 10 thus deformed, the flexible electrode 10 passes over the protruding portion 24 of the electrode portion 25b while rotating, and moves onto the opposed face 21 of the electrode portion 25b. The output member 40 attached to the flexible electrode 10 is displaced so as to move in accordance with movement of the flexible electrode 10. When voltage is applied to the flexible electrode 10 and the electrode portion 25b after the case shown in FIG. 4, the switch 54b is controlled to the ON state in FIG. 5. However, the switch 54b may be controlled to the OFF state.

As described above, the controller 70 of the drive circuit 50 repeats application and stop of voltage with respect to the electrode portions 25, in sequence in the relative movement direction R. The flexible electrode 10 can move in the relative movement direction R while rotating on the opposed face 21 of the base electrode 20.

In the manner as described above, the actuator 1 of the first embodiment can achieve operation to move the flexible electrode 10 relative to the base electrode 20. In addition, the output member 40 can move along various paths, according to movement of the flexible electrode 10, and cause an object to move along various paths. Thus, the actuator 1 of the first embodiment can provide a wide variety of patterns of usage as actuators.

In the actuator 1 shown in FIG. 1, the base electrode 20 does not move, and the flexible electrode 10 moves on the opposed face 21. However, the actuator 1 of the first embodiment may be constructed such that the flexible electrode 10 is rotatably supported without moving on the opposed face 21, and the base electrode 20 moves. In this case, the output member 40 may be attached to the base electrode 20.

Second Embodiment

Figure 6:
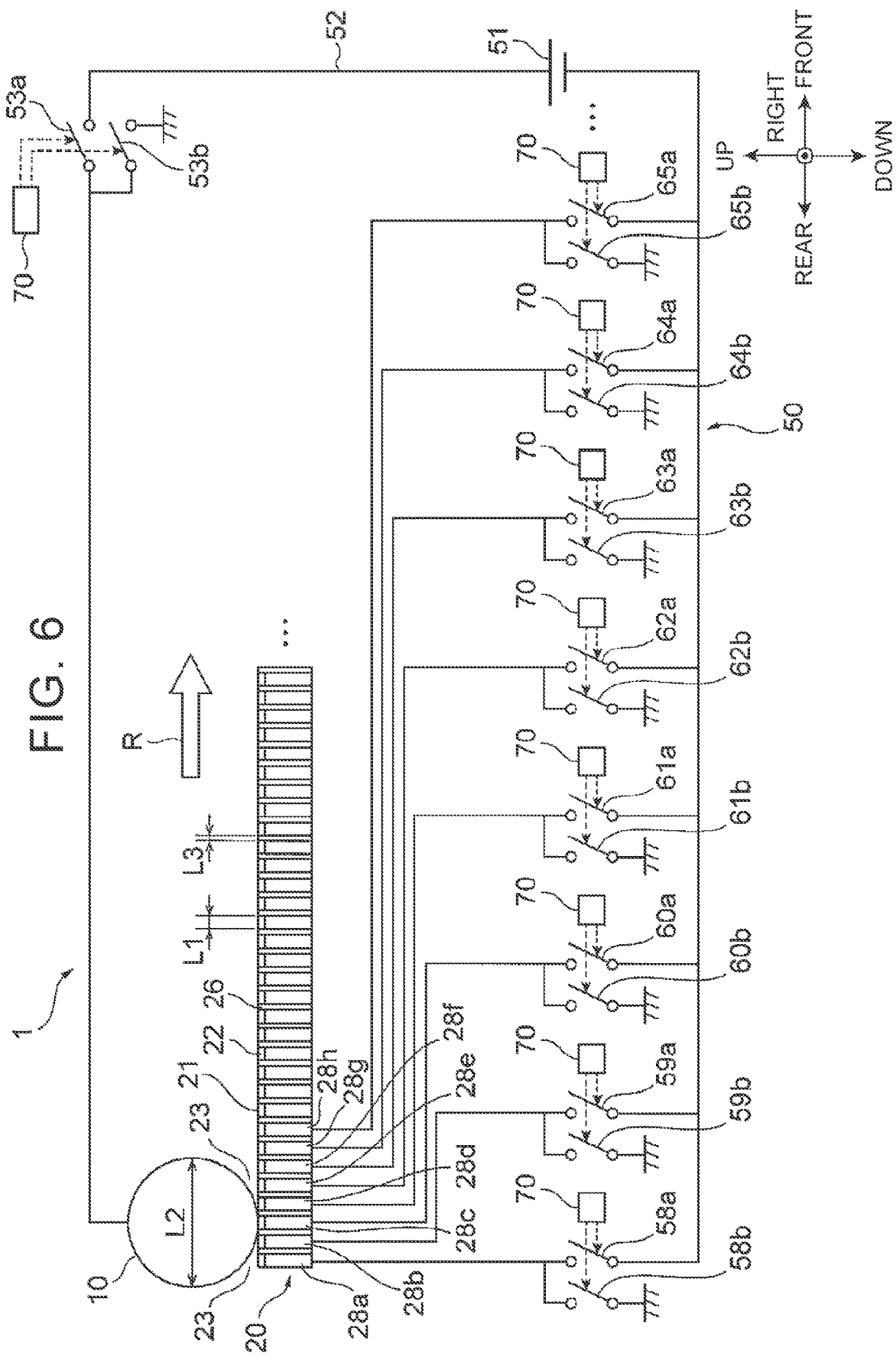
FIG. 6 is a view useful for describing an actuator of a second embodiment.

Referring to FIG. 6 to FIG. 9, the actuator 1 according to a second embodiment will be described. The configuration and operation of the actuator 1 of the second embodiment, which are identical with or similar to those of the previous embodiment, will not be described herein. FIG. 6 is useful for describing the actuator 1 of the second embodiment.

In the actuator 1 of the second embodiment, the base electrode 20 consists of a plurality of electrode portions 28a to 28h, in place of the electrode portions 25a to 25d. The length L1 of each of the electrode portions 28a to 28h measured in the relative movement direction R is shorter than the length L2 of the flexible electrode 10 measured in the relative movement direction R (L1<L2). Each of the electrode portions 28a to 28h is not formed with the protruding portion 24. The opposed faces 21 of the respective electrode portions 28a to 28h are flat, and are arranged on the same plane. In this embodiment, each of the electrode portions 28a to 28h will also be generally called "electrode portion 28".

The drive circuit 50 of the second embodiment includes switches 58a to 65b corresponding to the electrode portions 28a to 28h, in place of the switches 54a to 57b. The switch 58a is connected between the electrode portion 28a and the power supply 51. The switch 58b is connected between the electrode portion 28a and the frame ground. The switch 59a is connected between the electrode portion 28b and the power supply 51. The switch 59b is connected between the electrode portion 28b and the frame ground. The switch 60a is connected between the electrode portion 28c and the power supply 51. The switch 60b is connected between the electrode portion 28c and the frame ground. The switch 61a is connected between the electrode portion 28d and the power supply 51. The switch 61b is connected between the electrode portion 28d and the frame ground. The switch 62a is connected between the electrode portion 28e and the power supply 51. The switch 62b is connected between the electrode portion 28e and the frame ground. The switch 63a is connected between the electrode portion 28f and the power supply 51. The switch 63b is connected between the electrode portion 28f and the frame ground. The switch 64a is connected between the electrode portion 28g and the power supply 51. The switch 64b is connected between the electrode portion 28g and the frame ground. The switch 65a is connected between the electrode portion 28h and the power supply 51. The switch 65b is connected between the electrode portion 28h and the frame ground.

Figure 7:
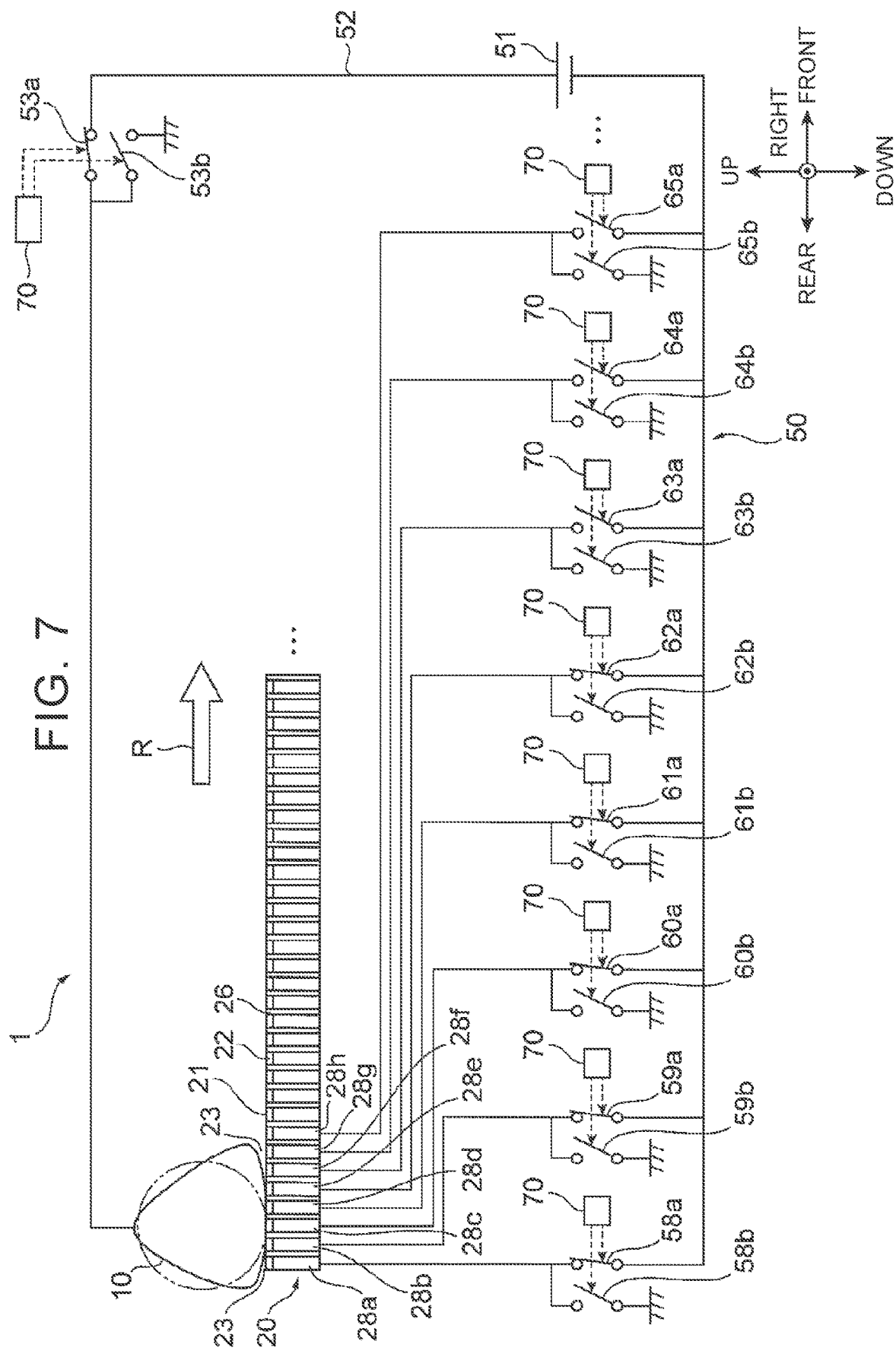
FIG. 7 is a view (No. 1) useful for describing a process of driving the actuator shown in FIG. 6.
Figure 8:
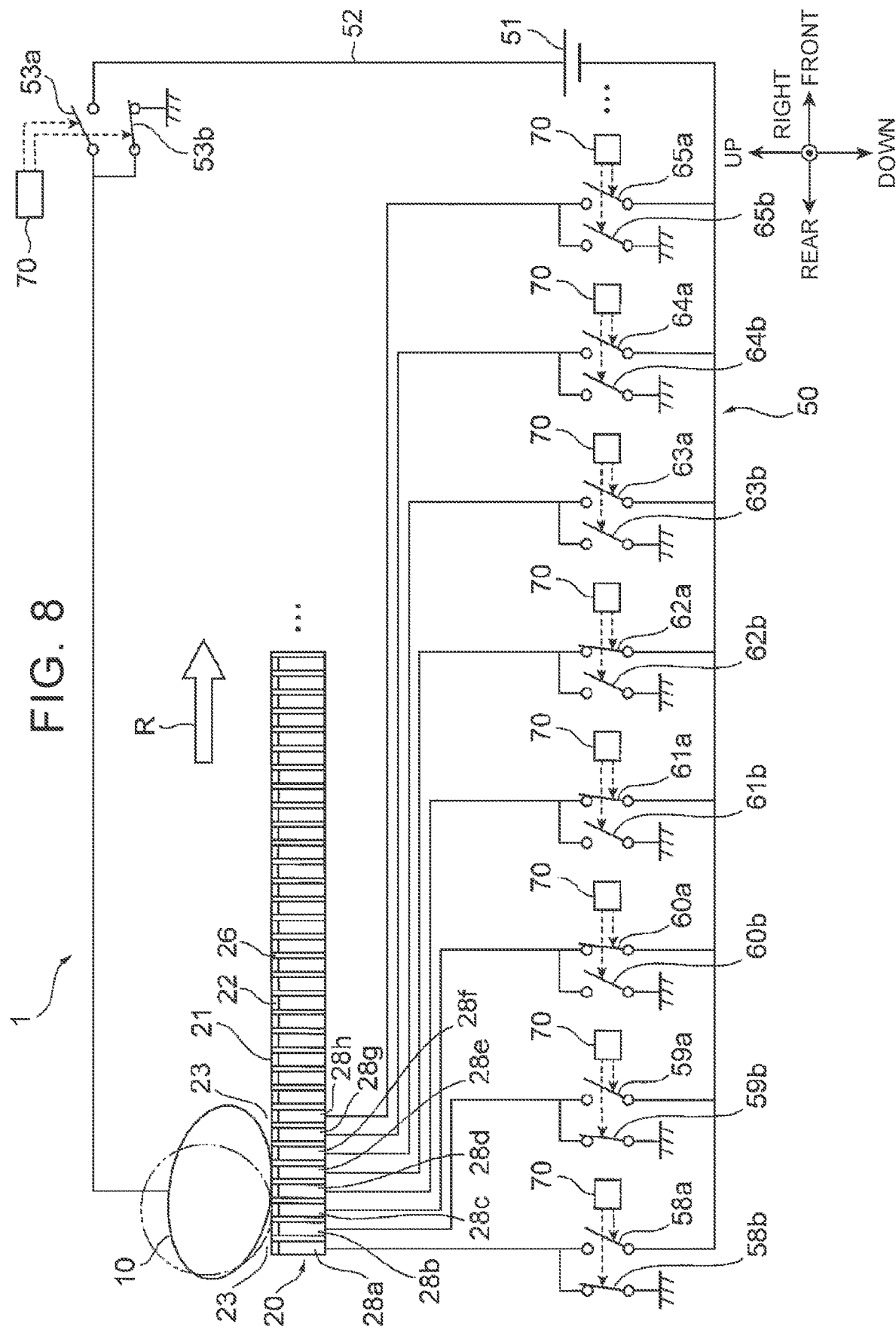
FIG. 8 is a view (No. 2) useful for describing the process of driving the actuator shown in FIG. 6.
Figure 9:
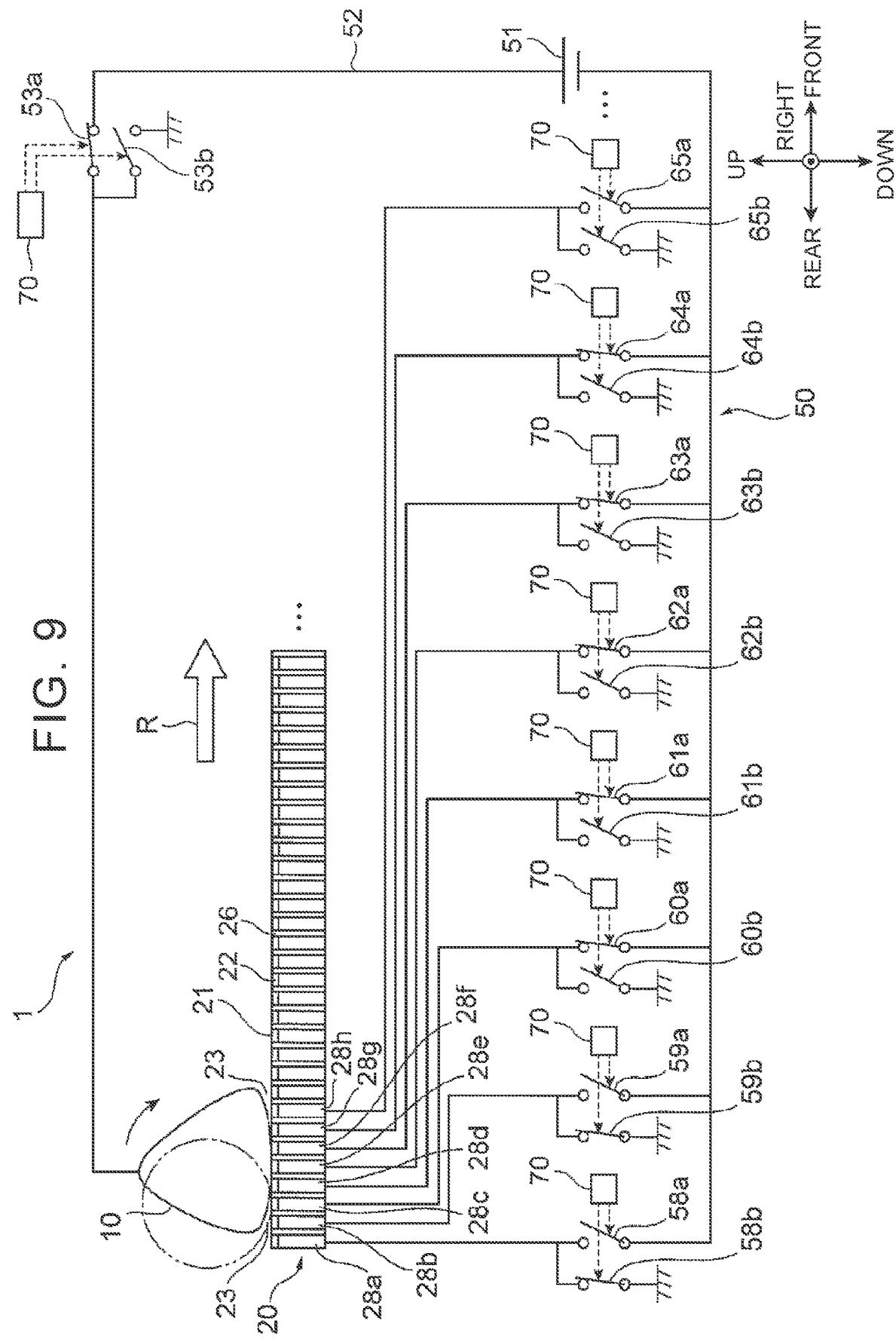
FIG. 9 is a view (No. 3) useful for describing the process of driving the actuator shown in FIG. 6.

FIG. 7 is a view (No. 1) useful for describing a process of driving the actuator 1 shown in FIG. 6. FIG. 8 is a view (No. 2) useful for describing the process of driving the actuator 1 shown in FIG. 6. FIG. 9 is a view (No. 3) useful for describing the process of driving the actuator 1 shown in FIG. 6. In FIG. 7 to FIG. 9, two-dot chain lines indicate the original shape of the flexible electrode 10 at the initial position before application of voltage.

As shown in FIG. 7, the controller 70 of the drive circuit 50 controls the switches 53a, 58a, 59a, 60a, 61a, 62a to the ON states, and controls the switches 53b, 58b, 59b, 60b, 61b, 62b to the OFF states. Also, the controller 70 controls the switches 63a to 65b to the OFF states. Then, voltage is applied to the flexible electrode 10, and the electrode portions 28a to 28e corresponding to the position of the flexible electrode 10. In this case, the flexible electrode 10 deforms so as to get closer to the opposed faces 21 of the electrode portions 28a to 28e.

The controller 70 of the drive circuit 50 can select the electrode portions 28 corresponding to the position of the flexible electrode 10, to which portions voltage is to be applied in the case shown in FIG. 7, in the following manner. The controller 70 selects the electrode portion 28c that is closest to the position at which the flexible electrode 10 contacts with the opposed face 21, as a reference. Then, the controller 70 selects a given number N of electrode portions 28d, 28e and electrode portions 28a, 28b located adjacent to the reference electrode portion 28c in the front direction and rear direction, respectively, as the electrode portions 28 to which voltage is to be applied in the case shown in FIG. 7. The given number N is determined in advance, based on the length L1 of the electrode portion 28 measured in the relative movement direction R, the length L2 of the flexible electrode 10 measured in the relative movement direction R, and the length L3 of the insulating portion 26 measured in the relative movement direction R. For example, the controller 70 may determine the given number N, so that the length {N×L1+(N−1)×L3} from the selected electrode portion 28a to electrode portion 28e in the relative movement direction R is 0.5 times or more and equal to or less than the length L2 of the flexible electrode 10 measured in the relative movement direction R.

After the case shown in FIG. 7, the controller 70 of the drive circuit 50 controls the switches 53b, 58b, 59b, 60a, 61a, 62a to the ON states, and controls the switches 53a, 58a, 59a, 60b, 61b, 62b to the OFF states, as shown in FIG. 8. Also, the controller 70 controls the switches 63a to 65b to the OFF states. In this case, the electrode portions 28a, 28b corresponding to a rear end portion (an end portion in a direction opposite to the relative movement direction R) of the flexible electrode 10, among the electrode portions 28a to 28e to which voltage is applied in the case shown in FIG. 7, and the flexible electrode 10, are electrically connected to the frame ground, and application of voltage is stopped. As a result, electric charge accumulated in the electrode portions 28a, 28b and the flexible electrode 10 is released to the frame ground. Thus, the rear end portion of the flexible electrode 10 deforms so as to be spaced apart from the opposed faces 21 of the electrode portions 28a, 28b, under the restoring force of the flexible electrode 10. On the other hand, the electrode portions 28c to 28e corresponding to a front end portion (an end portion in the relative movement direction R) and a middle portion (portion between the front end portion and the rear end portion) of the flexible electrode 10 are kept electrically connected to the power supply 51. As a result, electric charge accumulated in the electrode portions 28c to 28e is maintained. Thus, the front end portion and middle portion of the flexible electrode 10 are kept in a condition where they deform so as to get closer to the opposed faces 21 of the electrode portions 28c to 28e. Namely, only the rear end portion of the flexible electrode 10 reverts to its original shape. A moment that causes the flexible electrode 10 to rotate to move in the front direction is applied to the flexible electrode 10. As a result, the flexible electrode 10 passes over the electrode portion 28e on the front side of the flexible electrode 10 in the front direction, among the electrode portions 28c to 28e to which voltage is applied, and is brought into contact with the opposed face 21 of the electrode portion 28f located adjacent to the electrode portion 28e in the front direction.

After the case shown in FIG. 8, the controller 70 of the drive circuit 50 controls the switches 53a, 58b, 59b, 60a, 61a, 62a, 63a, 64a to the ON states, and controls the switches 53b, 58a, 59a, 60b, 61b, 62b, 63b, 64b to the OFF states, as shown in FIG. 9. Also, the controller 70 controls the switches 65a, 65b to the OFF states. Then, voltage is generated between the flexible electrode 10 and the electrode portions 28c to 28g. In this case, coulomb force is newly generated between the insulating layers 22 of the electrode portions 28f, 28g to which voltage is newly applied as compared with the case shown in FIG. 7, and the flexible electrode 10. With the coulomb force thus generated, the front end portion of the flexible electrode 10 that contacts with the opposed face 21 of the electrode portion 28f deforms so as to get closer to the opposed faces 21 of the electrode portions 28f, 28g. A moment that rotates the flexible electrode 10 to move it in the front direction is applied to the flexible electrode 10. As a result, the flexible electrode 10 can pass over the electrode portion 28f, while rotating, and moves to such an extent that it contacts with the opposed face 21 of the electrode portion 28g.

The controller 70 of the drive circuit 50 can select the electrode portions 28 to which voltage is to be newly applied in the case shown in FIG. 9, in the same manner as in the case shown in FIG. 7. Namely, the controller 70 of the drive circuit 50 selects the same number of electrode portions 28 as the electrode portions 28 corresponding to the rear end portion of the flexible electrode 10 for which application of voltage is stopped in the case shown in FIG. 8, which are located ahead in the relative movement direction R, as the electrode portions 28 to which voltage is to be newly applied.

As described above, the controller 70 of the drive circuit 50 applies voltage to the flexible electrode 10, and the electrode portions 28a to 28e corresponding to the position of the flexible electrode 10. Then, the controller 70 stops application of voltage to the electrode portions 28a, 28b corresponding to the rear end portion of the flexible electrode 10. Then, the controller 70 newly applies voltage to the electrode portions 28f, 28g located ahead of the flexible electrode 10 in the relative movement direction R. Thus, the controller 70 of the drive circuit 50 repeats application of voltage to two or more electrode portions 28 and stop of the application, in sequence in the relative movement direction R. In this manner, the flexible electrode 10 can move in the relative movement direction R while rotating on the opposed face 21 of the base electrode 20.

Since the length L1 of the electrode portion 28 is shorter than the length L2 of the flexible electrode 10, the actuator 1 of the second embodiment can achieve operation to move the flexible electrode 10 relative to the base electrode 20, without forming the protruding portions 24 on the electrode portions 28. The base electrode 20 of the second embodiment may be simpler in shape than that of the first embodiment, and the degree of freedom in design may be improved. Further, the drive circuit 50 of the second embodiment can finely control voltage applied to the flexible electrode 10 and the base electrode 20, and thus can accurately control movement of the flexible electrode 10. The degree of freedom in the pattern of movement of the flexible electrode 10 may be improved. Thus, the actuator 1 of the second embodiment can easily provide an even wider variety of patterns in usage.

Third Embodiment

Figure 11:
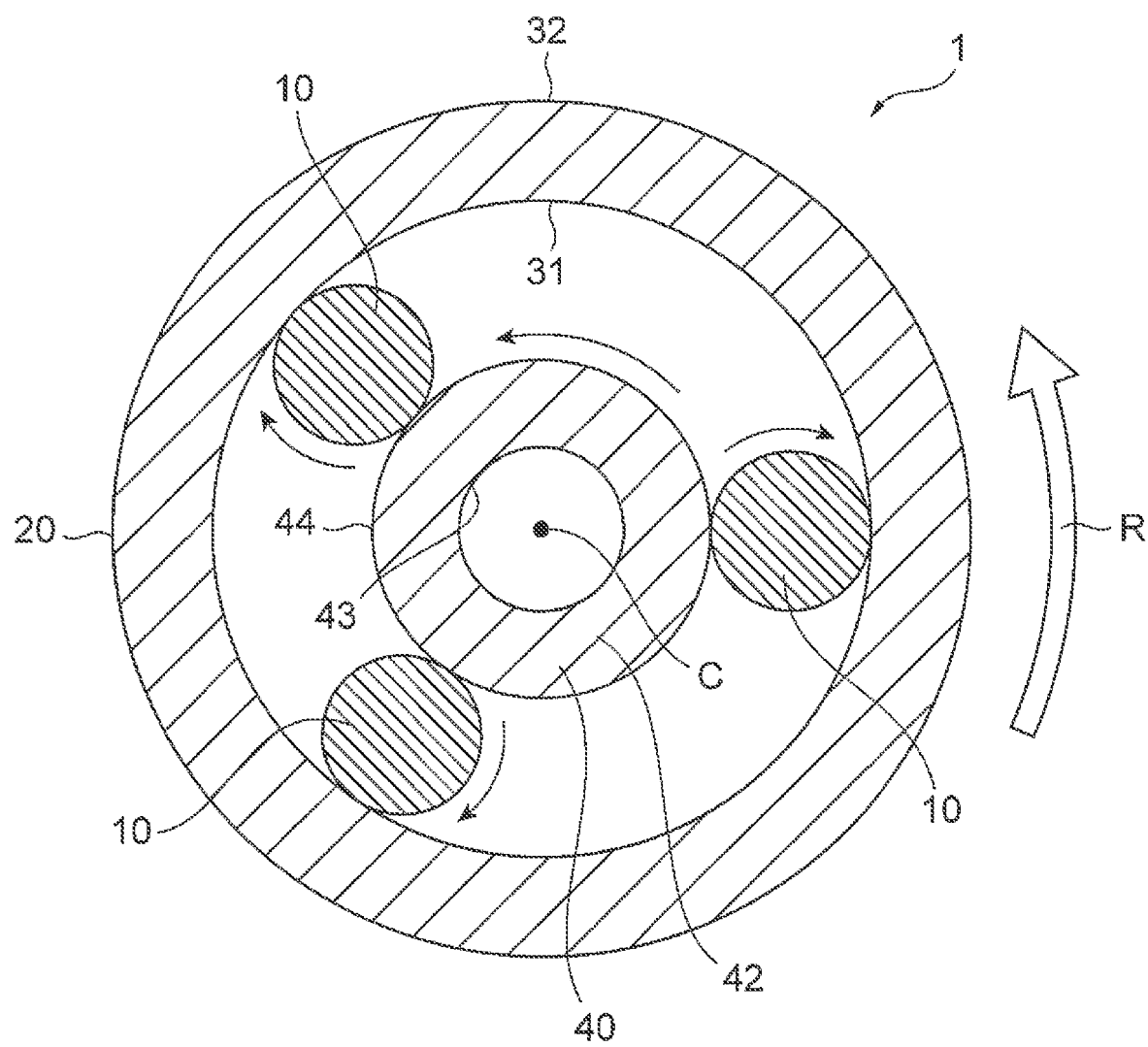
FIG. 11 is a view useful for describing an actuator of a fourth embodiment.

Referring to FIG. 10, the actuator 1 according to a third embodiment will be described. The configuration and operation of the actuator 1 of the third embodiment, which are identical with or similar to those of the previous embodiments, will not be described herein. FIG. 10 is useful for describing the actuator 1 of the third embodiment. FIG. 10 shows a cross section taken along the relative movement direction R of the actuator 1. In FIG. 10, a plurality of electrode portions 28 and insulating portions 26 that constitute the base electrode 20, insulating layer 22, and drive circuit 50 are not illustrated. In FIG. 11, too, these components are not illustrated.

In the actuator 1 of the third embodiment, the base electrode 20 is formed in the shape of a circular ring or a cylinder, for example. The base electrode 20 is formed by connecting the electrode portions 28 located at both ends of the base electrode 20 of the second embodiment, via the insulating portion 26. The base electrode 20 has an inner circumferential surface 31 and an outer circumferential surface 32. The opposed face 21 of the base electrode 20 is the inner circumferential surface 31. The base electrode 20 is placed on a plane P outside the actuator 1. The outer circumferential surface 32 of the base electrode 20 is in contact with the plane P. The flexible electrode 10 of the third embodiment is located inside the base electrode 20. The flexible electrode 10 is placed on the inner circumferential surface 31 of the base electrode 20. The relative movement direction R of the flexible electrode 10 extends along the circumferential direction of the inner circumferential surface 31.

The drive circuit 50 of the third embodiment repeats application and stop of voltage with respect to the electrode portions 28, in sequence in the relative movement direction R, as in the second embodiment. The flexible electrode 10 moves on the inner circumferential surface 31 of the base electrode 20, relative to the base electrode 20, while rotating on the inner circumferential surface 31. The center of gravity of the base electrode 20 incorporating the flexible electrode 10 moves according to movement of the flexible electrode 10. The base electrode 20 moves on the plane P while rotating on the plane P, as indicated by an arrow of a broken line in FIG. 10.

As in the first embodiment, the output member 40 of the third embodiment may be attached to the base electrode 20 that moves on the plane P, and may be provided by a rod-like member that extends from the base electrode 20 in the lateral direction. Also, where two or more pairs of the base electrode 20 and the flexible electrode 10 are provided, the output member 40 may be provided by the plate-like member 41 placed on the base electrodes 20, as in the first embodiment.

The actuator 1 of the third embodiment can achieve operation to move the flexible electrode 10 relative to the base electrode 20, as in the first and second embodiments. It is, however, to be noted that the flexible electrode 10 of the third embodiment moves on the inner circumferential surface 31 of the base electrode 20, relative to the base electrode 20, while rotating on the inner circumferential surface 31. The base electrode 20 of the third embodiment can move according to movement of the flexible electrode 10. The actuator 1 of the third embodiment can be used as an actuator in various forms different from those of the first and second embodiments. Thus, the actuator 1 of the third embodiment can provide a wide variety of patterns of usage.

Fourth Embodiment

Referring to FIG. 11, the actuator 1 according to a fourth embodiment will be described. The configuration and operation of the actuator 1 of the fourth embodiment, which are identical with or similar to those of the previous embodiments, will not be described herein. FIG. 11 is useful for describing the actuator 1 of the fourth embodiment.

In the actuator 1 of the fourth embodiment, the output member 40 that does work to the outside according to movement of the flexible electrodes 10 is provided by a rotating body 42 located inside the base electrode 20. The rotating body 42 is a three-dimensional object formed by rotating a plane, such as a rectangular plane, on the same plane as a certain axis, in an orbital direction of the axis. The rotating body 42 is formed in the shape of a circular ring, cylinder, or solid cylinder, for example. In FIG. 11, the output member 40 in the form of the rotating body 42 is formed in an annular shape, and has an inner circumferential surface 43 and an outer circumferential surface 44. The outer circumferential surface 44 of the output member 40 is opposed to the inner circumferential surface 31 of the base electrode 20. The central axis of rotation of the output member 40 may coincide with the central axis C of the base electrode 20. A shaft, or the like, that extends along the central axis of rotation of the output member 40 may be attached to the inner circumferential surface 43 of the output member 40, integrally with the output member 40.

In the fourth embodiment, two or more flexible electrode 10 is provided. Each of the flexible electrodes 10 is located between the inner circumferential surface 31 of the base electrode 20 and the outer circumferential surface 44 of the output member 40, in a condition where it is in contact with both of the surfaces 31, 44. The flexible electrodes 10 support the output member 40 such that the output member 40 can rotate in the orbital direction of the central axis of rotation of the output member 40. The base electrode 20 of the fourth embodiment is fixed so as not to rotate and move.

The drive circuit 50 of the fourth embodiment repeats application and stop of voltage with respect to the electrode portions 28, in sequence in the relative movement direction R, as in the third embodiment. Each of the flexible electrodes 10 moves on the inner circumferential surface 31 of the base electrode 20, relative to the base electrode 20, while rotating on the inner circumferential surface 31. The output member 40 that is in contact with each of the flexible electrodes 10 rotates according to movement of the flexible electrodes 10.

The actuator 1 of the fourth embodiment can achieve operation to move the flexible electrodes 10 relative to the base electrode 20, as in the first to third embodiments. It is, however, to be noted that the flexible electrodes 10 of the fourth embodiment move on the inner circumferential surface 31 of the base electrode 20, relative to the base electrode 20, while rotating on the inner circumferential surface 31, as in the third embodiment. The output member 40 of the fourth embodiment can rotate according to movement of the flexible electrodes 10. The actuator 1 of the fourth embodiment can be used as an actuator in various forms different from those of the first to third embodiments. Thus, the actuator 1 of the fourth embodiment can provide a wide variety of patterns of usage.

In the actuator 1 shown in FIG. 11, the rotating body 42 provides the output member 40. Then, in the actuator 1 shown in FIG. 11, the base electrode 20 is fixed, and the rotating body 42 is configured to rotate. However, in the actuator 1 of the fourth embodiment, the rotating body 42 may not provide the output member 40. Then, in the actuator 1 of the fourth embodiment, the rotating body 42 may be fixed, and the base electrode 20 may be configured to rotate. Namely, in the actuator 1 of the fourth embodiment, the rotating body 42 or the base electrode 20 may be configured to rotate. When the base electrode 20 is configured to rotate, the output member 40 may be constructed similarly to the third embodiment, and attached to the base electrode 20.

While some embodiments of the present disclosure have been described in detail, the present disclosure is not limited to the illustrated embodiments, but various changes in design may be made without departing from the principle of the present disclosure described in the appended claims. According to the present disclosure, the configuration of a certain embodiment may be added to the configuration of another embodiment, or the configuration of a certain embodiment may be replaced with that of another embodiment, or a part of the configuration of a certain embodiment may be deleted.

What is claimed is:

1. An actuator comprising a flexible electrode having flexibility, and a base electrode having an opposed face that is opposed to the flexible electrode and is covered with an insulating layer, the flexible electrode being configured to deform to get closer to the opposed face when a voltage is applied to the flexible electrode and the base electrode,
    wherein the flexible electrode is a rotating body placed on the opposed face,
    wherein the base electrode is divided into a plurality of electrode portions insulated from each other,
    wherein the electrode portions are arranged along a predetermined direction, and
    wherein the flexible electrode is configured to move in the predetermined direction relative to the base electrode, while rotating on the opposed face, when the voltage is sequentially applied to the electrode portions in the predetermined direction.

2. The actuator according to claim 1, wherein:
    the base electrode is formed in an annular shape, and has an inner circumferential surface;
    the flexible electrode is placed on the inner circumferential surface;
    the opposed face is the inner circumferential surface; and
    the predetermined direction extends along a circumferential direction of the inner circumferential surface.

3. The actuator according to claim 2, further comprising an output member that generates work to an outside according to movement of the flexible electrode, wherein:
    the output member is a rotating body that is located inside the base electrode, and has an outer circumferential surface that is opposed to the inner circumferential surface of the base electrode; and
    the flexible electrode is placed between the inner circumferential surface of the base electrode and the outer circumferential surface of the output member, in a condition where the flexible electrode is in contact with the inner circumferential surface and the outer circumferential surface.

4. The actuator according to claim 1, wherein a length of each of the electrode portions measured in the predetermined direction is shorter than a length of the flexible electrode measured in the predetermined direction.

* * * * *